United States Patent [19]
Sugimoto et al.

[11] Patent Number: 5,144,164
[45] Date of Patent: Sep. 1, 1992

[54] BICMOS CURRENT SWITCHING CIRCUIT HAVING A PLURALITY OF RESISTORS OF A SPECIFIED VALUE

[75] Inventors: Yasuhiro Sugimoto; Satoshi Mizoguchi, both of Yokohama; Hiromi Mafune, Sagamihara, all of Japan

[73] Assignee: Kabushiki Kaisha Toshiba, Kawasaki, Japan

[21] Appl. No.: 567,708

[22] Filed: Aug. 14, 1990

Related U.S. Application Data

[63] Continuation of Ser. No. 323,696, Mar. 15, 1989, abandoned.

[30] Foreign Application Priority Data

Mar. 18, 1988 [JP] Japan .................................. 63-66536

[51] Int. Cl.⁵ .................... H03K 17/16; H03K 19/094
[52] U.S. Cl. .................................. 307/446; 307/454; 307/455; 307/530; 307/355; 307/356
[58] Field of Search ................ 307/443, 446, 454–455, 307/570, 530, 355–356

[56] References Cited

U.S. PATENT DOCUMENTS 3,902,078  8/1975  Peterson .............................. 307/304
4,645,951  2/1987  Uragani .............................. 307/446

OTHER PUBLICATIONS

Electronique et Microelectronique Industrielles, vol. RT-45, No. 152, Mar. 1, 1972, pp. 35-37; F. Charles: "Des Multiplexeurs Rapides Pour Signaux Analogiques".

IEEE Journal of Solid-State Circuits, vol. SC-17, No. 2, Apr. 1982, pp. 367-374, IEEE, New York, US; R. J. Bayruns et al.: "A Fine-Line nMOS IC for Raster-Scan Control of a 500-MHz Electron-Beam Deflection System".

Electronics, vol. 52, No. 24, Nov. 22, 1979, pp. 140-144; B. Blood et al.: "10-ns Monolithic d-a Converter Keeps Bipolar Drive Circuits Hustling".

Patent Abstracts of Japan, vol. 8, No. 123 (E-249) [1560], 8th Jun. 1984; and JP-A-59 36 423 (Hitachi) Feb. 28, 1984.

Sugimoto et al., "High Performance and Versatile Bi-CMOS Electronic Volume IC", The Transactions of the IEICE, vol. E71, No. 4, pp. 289-291, Apr. 1988.

Primary Examiner—Stanley D. Miller
Assistant Examiner—Margaret Rose Wambach
Attorney, Agent, or Firm—Finnegan, Henderson, Farabow, Garrett and Dunner

[57] ABSTRACT

A current switching circuit includes first and second FETs of the same channel type whose drain-source paths are commonly connected at one end and whose gates are connected to receive logic input signals in an inverted relation, and the other end of the drain-source path of the first FET is connected to an external circuit. The current switching circuit further includes a bipolar transistor connected to a commonly connected node between the drain-source paths of the first and second FETs.

10 Claims, 6 Drawing Sheets

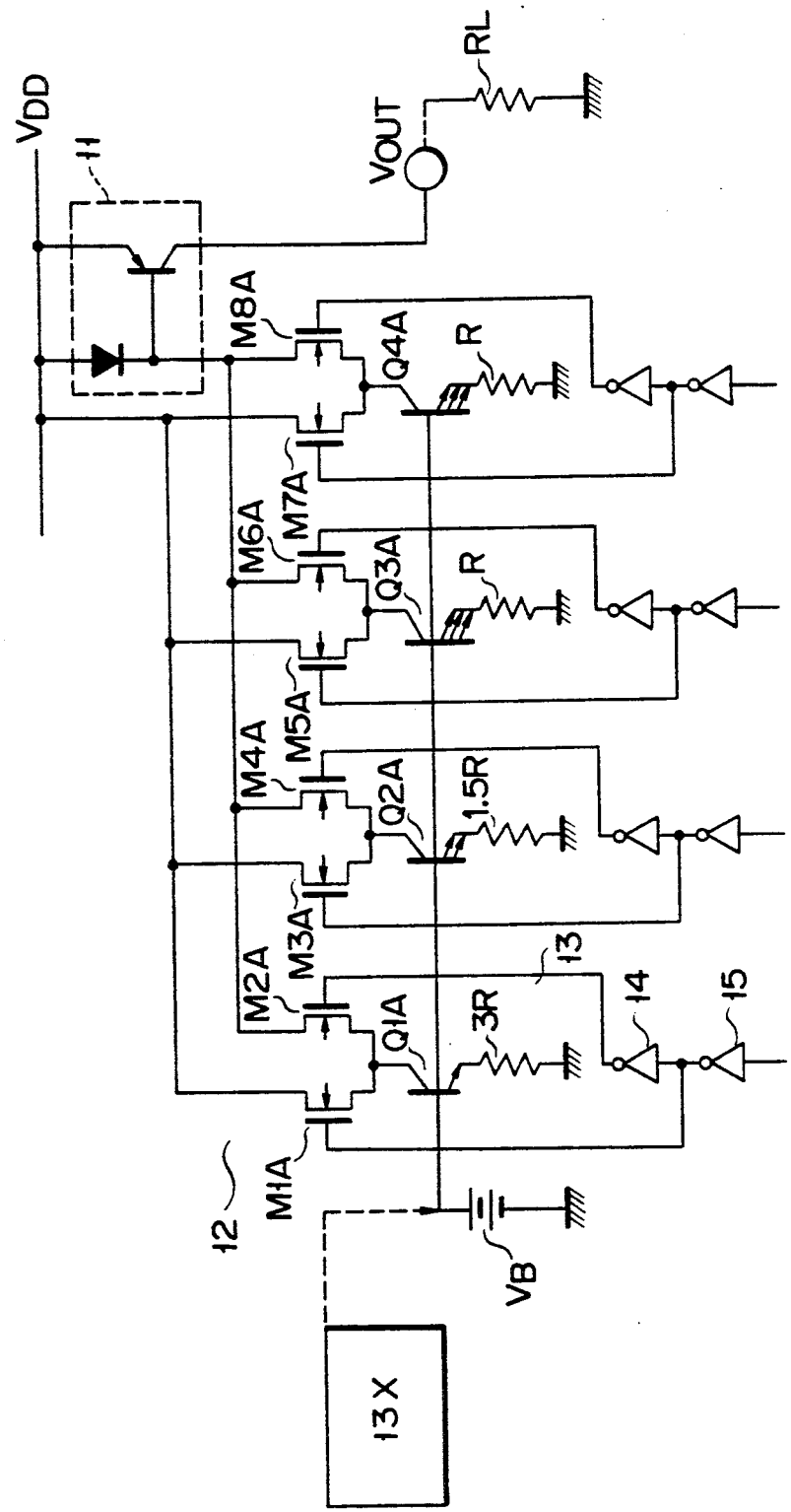
F I G. 2

BICMOS CURRENT SWITCHING CIRCUIT HAVING A PLURALITY OF RESISTORS OF A SPECIFIED VALUE

This application is a continuation of application Ser. No. 07/323,696, filed Mar. 15, 1989, now abandoned.

BACKGROUND OF THE INVENTION

1. Field of the Invention

This invention relates to a current switching circuit having at least one current switch and a constant current source.

2. Description of the Related Art

FIG. 4 shows an example of the conventional current switching circuit. The current switching circuit includes current switch 2 having bipolar transistors Q1 and Q2 whose emitters are connected to each other and current source 3 having bias voltage source VB, resistor R1 and bipolar transistor Q3 which is set in the conductive state. A logic input (IN, IN) is supplied to the base of transistor Q1 and a reference voltage (logic threshold adjust) is supplied to the base of transistor Q2. Further, the collector of transistor Q1 is connected to output circuit 1 and the collector of transistor Q2 is connected to power source VDD.

The current switching circuit controls the current by selectively turning on one of transistors Q1 and Q2 according to the logic input supplied to the base of transistor Q1.

Assume that the output of a CMOS inverter is used to drive current switch 2 of the above conventional current switching circuit. In a case where the bipolar transistor is directly driven by the output of the CMOS inverter, there is a possibility that the bipolar transistor will be operated in a saturation region. Therefore, it is necessary to sue a level converting circuit so as to convert the output level of the CMOS inverter to a corresponding level within the operation range of the bipolar transistor. Use of the level converting circuit makes the circuit construction complex. In contrast, where current switch 2 is formed of FETs, the FET can be driven by the output of the CMOS inverter without using a level converting circuit. However, in this case, the characteristic of current source 3 becomes deteriorated. This is because drain current ID will greatly vary with respect to voltage VDS between the source and drain because of the channel modulation of the FET. Even when the Early effect of the bipolar transistor is taken into consideration, the bipolar transistor type current source can supply a more stable current.

SUMMARY OF THE INVENTION

An object of this invention is to provide a current switching circuit capable of driving a current switch without converting the level of a logic input and supplying an output with high stability irrespective of fluctuation of the current source voltage.

According to one aspect of this invention, there is provided a current switching circuit comprising a current switch having first and second FETs of the same channel type whose drain-source paths are connected at one end to each other and respectively connected at the other end to an output circuit (11) acting as a first external circuit and a power source section (VDD) acting as a second external circuit, and whose gates are connected to receive logic inputs in an inverted relationship via a MOS inverter circuit; and a current source having a bipolar transistor connected to a connection node between the commonly connected ends of the current paths of the first and second FETs.

Thus, in this invention, the current switch constructed by the FETs is directly driven by the output of the MOS inverter. The use of the FETs may make it unnecessary to convert the level of control signals. Further, since the current source is constructed by the bipolar transistor, and the amount of variation in the collector current in the bipolar transistor caused by variation in the power source voltage is smaller than the amount of variation in the drain current in the FET caused by the power source voltage variation, the output current can be made stable (constant).

Generally, a circuit is constituted by exclusively using either FETs or bipolar transistors. However, as described above, a current switching circuit of this invention is provided in the form of combination of FETs and a bipolar transistor. That is, the switching circuit includes the current switching section which is constituted by the FETs and the constant current source section which is constituted by the bipolar transistor so that the current switch can be driven without converting the logic input level and the output can be made stable (constant) irrespective of fluctuation in the power source voltage.

BRIEF DESCRIPTION OF THE DRAWINGS

FIGS. 2 and 3 are circuit diagrams showing other embodiments of this invention;

DETAILED DESCRIPTION OF THE PREFERRED EMBODIMENTS

There will now be described an embodiment of this invention with reference to the accompanying drawings.

Figure 1A:
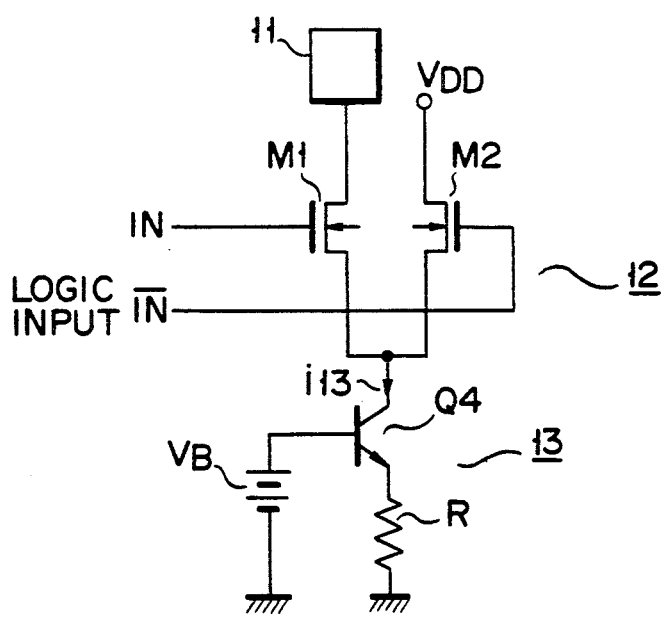
FIG. 1A is a circuit diagram showing one embodiment of this invention.

As shown in FIG. 1A, a current switching circuit according to one embodiment of this invention includes current switch 12 and constant current source 13 for driving current switch 12. Current switch 12 includes NMOS FETs M1 and M2 whose sources are connected together and whose drains are respectively connected to output circuit 11 used as a first external circuit and power source terminal VDD used as a second external circuit. Logic inputs IN and $\overline{\text{IN}}$ which are output from CMOS inverters 14 and 15 are supplied to the gates of FETs M1 and M2, respectively. Constant current source 13 includes bipolar transistor Q4 having a collector connected to a connection node between the sources of FETs M1 and M2, a base connected to bias voltage source VB and an emitter grounded via resistor R. Resistor R is used to determine current value i13 of current source 13.

Assume that, in FIG. 1A, $VDD = 12(V)$, $VB = 1.0(V)$ and $R = 3(K\Omega)$, for example. When a logic input of power source voltage VDD is supplied, FET M1 is turned on so that an output current can be supplied to output circuit 11. When a logic input of 0(V) is supplied, FET M1 is turned off to interrupt the supply of current to output circuit 11.

Figure 1B:
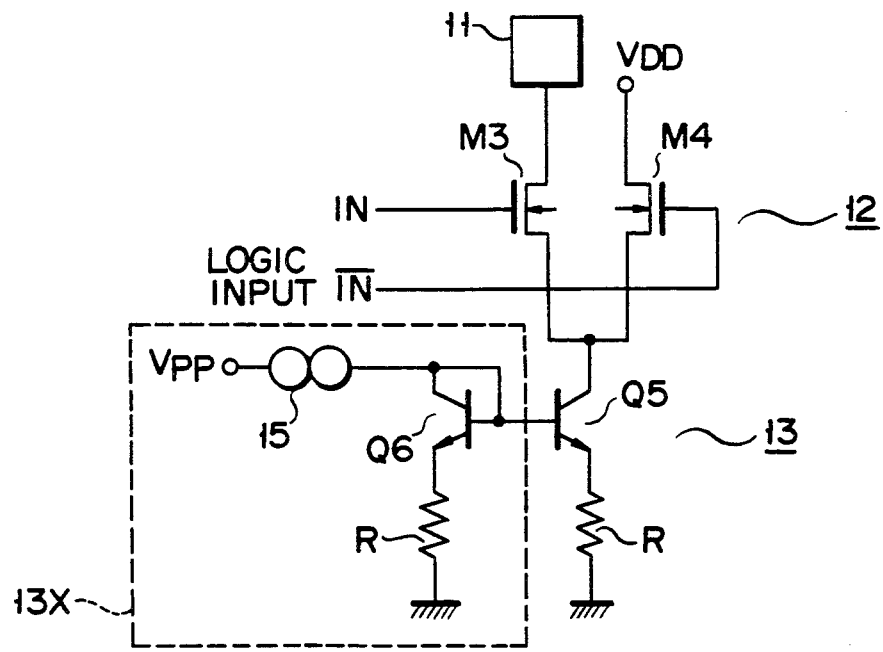
FIG. 1B is a circuit diagram showing an embodiment of this invention which includes a current mirror circuit.

FIG. 1B shows a current switching circuit according to an embodiment of this invention using current mirror circuit 13X. The current switching circuit is similar to that of FIG. 1A except that transistor Q4 is replaced by npn transistor Q5, and bias voltage source VB is replaced by current mirror circuit 13X having npn transistor Q6 whose base is connected to the base of transistor Q5 and whose emitter is grounded via resistor R. The base of transistor Q6 is further connected to its own collector and to high voltage terminal Vpp via constant current source 15. With this construction, the current from current source section 13 can be further stabilized.

FIG. 2 shows an embodiment in which four current switching circuit sections are connected in parallel and commonly connected to output circuit 11. In this example, the emitter areas of bipolar transistors Q1A to Q4A are set in the ratio of 1:2:3:3 and the emitter resistors thereof are set to have resistances of 3R, 1.5R, R and R, respectively. With this construction, it is possible to selectively supply one of currents of nine different current levels to load resistor RL which is connected to output circuit 11.

Figure 3:
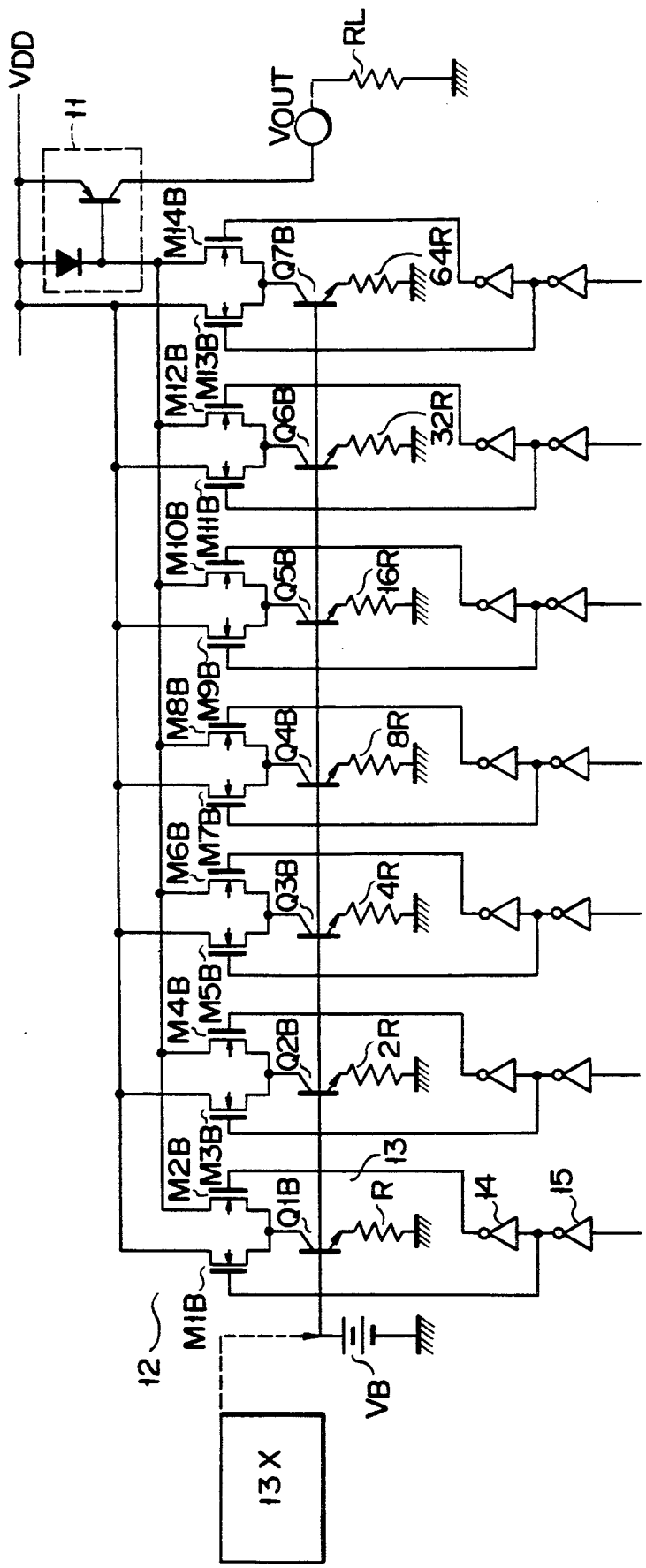

FIG. 3 shows an embodiment in which seven current switching circuit sections are connected in parallel. In this embodiment, bipolar transistors Q1B to Q7B are formed to have the same emitter areas, and the emitter resistors thereof are set to have resistances of R, 2R, 4R, 8R, 16R, 32R and 64R, respectively. In this embodiment, the same effect as that of the FIG. 2 embodiment can be attained.

Thus, proper selection the number of current switches 12 and the currents (resistances) of current source circuits 13 makes it possible to obtain a desired output.

Figure 6:
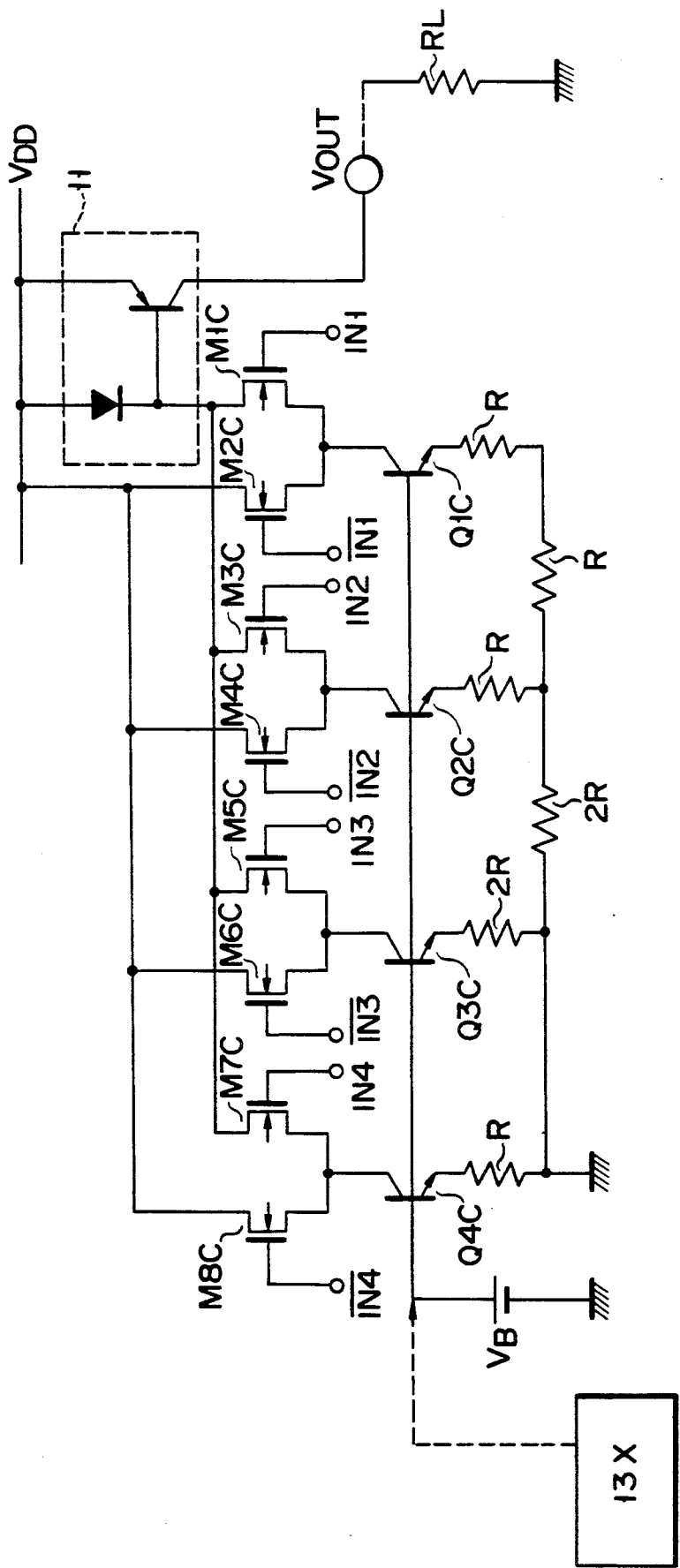
FIGS. 6 and 7 are circuit diagrams of the embodiments of this invention.
Figure 7:
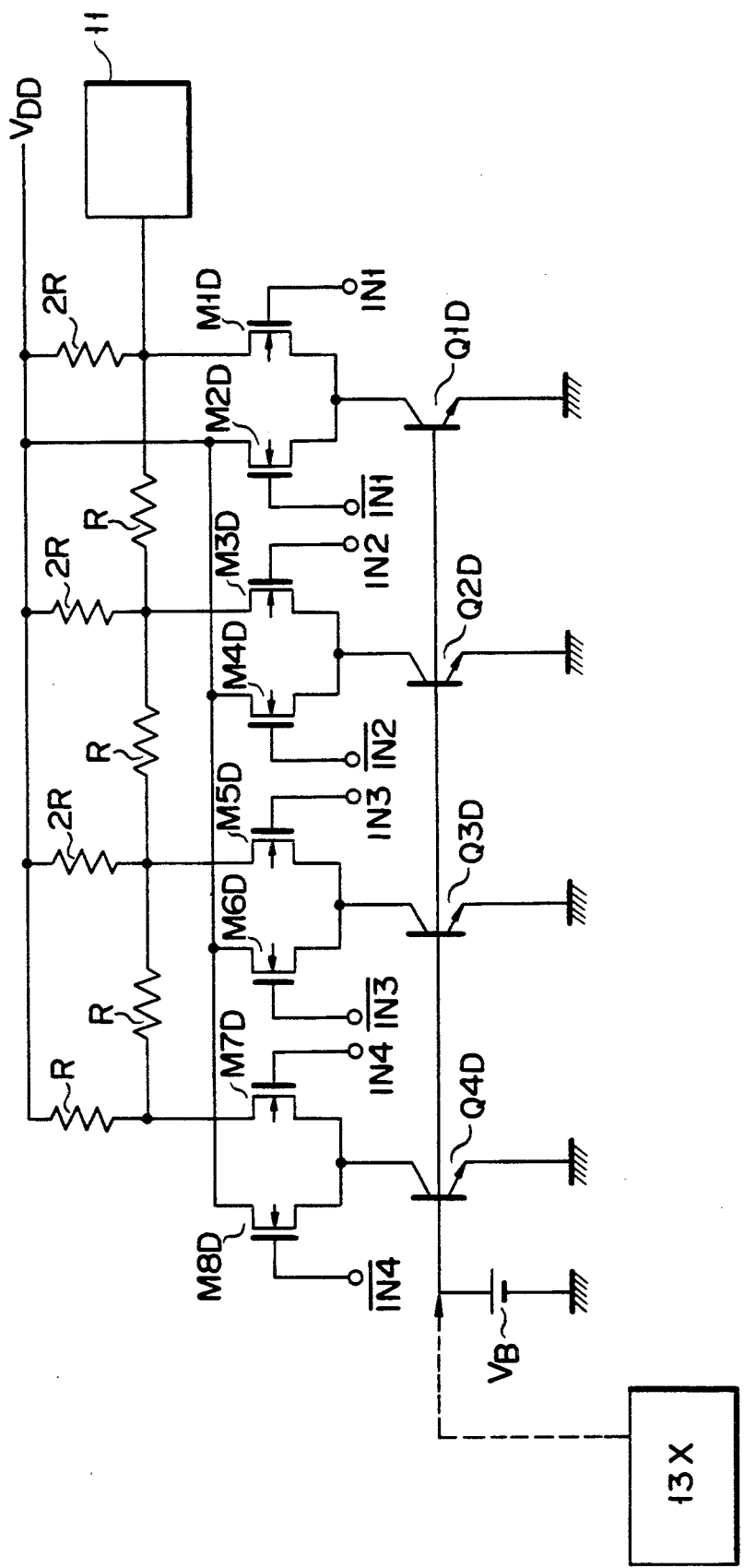

FIGS. 6 and 7 shown circuit diagrams of a current switching circuit according to other embodiments of this invention. In FIG. 6, the current switching circuit includes four current switching sections connected in parallel. The emitters of bipolar transistors Q1C to Q4C of the current switching sections are connected to each other via resistors. In FIG. 7, the drains of first FETs M1D, M3D, M5D and M7D are connected to each other via resistors.

It is possible to incorporate current mirror circuit 13X shown in FIG. 1B into any on e of circuits shown in FIGS. 2, 3, 6 and 7.

Figure 4:
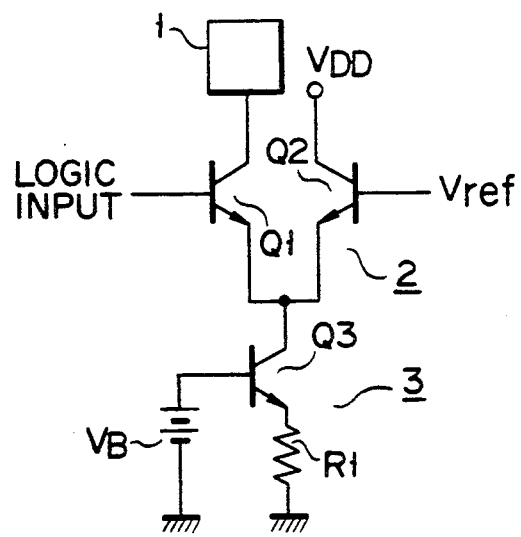
FIG. 4 is a circuit diagram showing the conventional current switching circuit.

If, in the conventional circuit shown in FIG. 4, a current mirror circuit or resistor is connected to output terminal 1, and when switching circuit 2 is driven by CMOS inverters, the following problem will occur. That is, when the base potential has reached a VDD level in this operating condition, the base potential of bipolar transistor Q1 becomes higher than the collector potential thereof and transistor Q1 will be driven into the saturation region. In order to prevent transistor Q1 from being driven into the saturation region, it is necessary to set the base potential of transistor Q1 within a preset operation potential range by use of a level converting circuit. The use of the level converting circuit makes the circuit construction complex.

Figure 5:
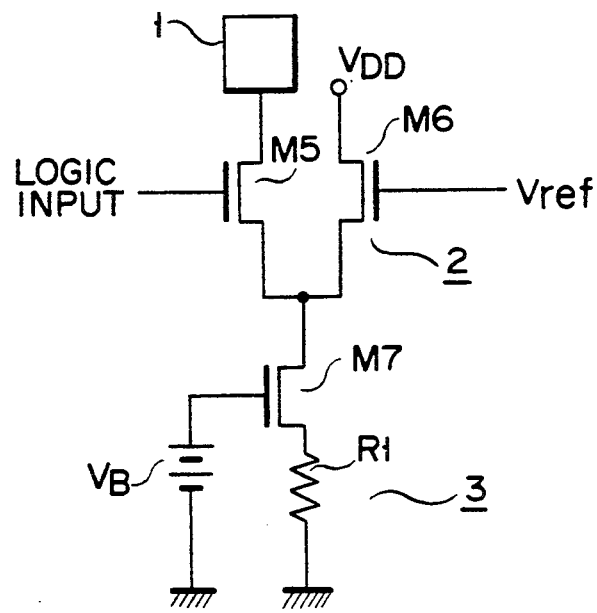
FIG. 5 is a circuit diagram showing the conventional current switching circuit using FETs.

FIG. 5 shows a current switching circuit formed of only FETs. In this case, it becomes easy to drive current switch 2. However, since the FET is used as the current source, it becomes difficult to stably hold an output current of output circuit 3 regardless of fluctuation in the power source voltage.

In this invention, since current switch 12 is constituted by MOS FETs, and the MOS FETs can be regarded as being a switch even when the gates of the MOS FETs are driven by a voltage varying between the ground potential level and VDD level or a voltage of CMOS level, no problem occurs. As a result, the circuit design can be simplified. Further, the amount of variation in collector current IC in the IC-VCE characteristic of the bipolar transistor can be made smaller than that in drain current ID in the MOS transistor caused by variation in power source voltage VDD. Therefore, the output current of output circuit 11 can be made stable (constant).

This invention has been described with reference to the embodiments, but it is not limited to these embodiments and can be variously modified without changing the technical scope thereof.

As described above, according to this invention, a current switching circuit can be provided in which the current switch can be driven without converting the logic input level and an output current can be stably supplied irrespective of fluctuation in the power source voltage.

What is claimed is:

1. A current switching circuit comprising:
   a first external circuit;
   a second external circuit;
   a first current supply means for supplying a first constant current to said second external circuit;
   a second current supply means for supplying a second constant current to said second external circuit;
   wherein each of said first current supply means and said second current supply means includes:
      a constant current supply means for supplying a present constant current, said constant current supply means including a bipolar transistor and a resistor for limiting said present constant current, said bipolar transistor and said resistor defining a current path, said resistor connected between an emitter of said bipolar transistor and a circuit ground;
      a switching means for switching said present constant current between said first external circuit and said second external circuit, said switching means including a first field effect transistor and a second field effect transistor of the same channel type, a first end of a drain-source path of said first field effect transistor and a first end of a drain-source path of said second field effect transistor commonly connected to said bipolar transistor, a second end of the drain-source path of said first field effect transistor connected to said first external circuit and a second end of drain-source path of said second field effect transistor connected to said second external circuit, and a gate of said first field effect transistor being responsive to a first logic input signal and a gate of said second field effect transistor being responsive to a second logic input signal which is antiphasic to said first logic input signal;
   wherein said resistor in the switching means of said first current supply means has a different resistive value than that of said resistor in the switching means of said second current supply means.

2. A current switching circuit according to claim 1, further comprising a plurality of said switching means and a plurality of said constant current supply means, said first external circuit being commonly connected to said plurality of said switching means at said second end of said drain-source path of said first field effect transistor in each of said plurality of said switching means and a plurality of resistors each being connected between the emitters of said bipolar transistors included in said plurality of said constant current supply means.

3. A current switching circuit according to claim 1, further comprising a plurality of said switching means and a plurality of said constant current supply means, wherein said second end of said drain-source path of said first field effect transistor in each of said plurality of said switching means is connected to said first external circuit via a resistor.

4. A current switching circuit according to claim 1, further comprising a second bipolar transistor for forming a current mirror circuit, wherein said constant current supply means is connected to the base of said second bipolar transistor.

5. A current switching circuit according to claim 1, further comprising a plurality of inverters for supplying a plurality of said first and second logic input signals.

6. A current switching circuit comprising:
a first external circuit;
a second external circuit;
a first current supply means for supplying a first constant current to said second external circuit;
a second current supply means for supplying a second constant current to said second external circuit;
wherein each of said first current supply means and said second current supply means includes;
a constant current supply means for supplying a present constant current, said constant current supply means including a bipolar transistor and a resistor for limiting said present constant current, said bipolar transistor and said resistor defining a current path, said resistor connected between an emitter of said bipolar transistor and a circuit ground;
a switching means for switching said present constant current between said first external circuit and said second external circuit, said switching means including a first field effect transistor and a second field effect transistor of the same channel type, a first end of a drain-source path of said first field effect transistor and a first end of a drain-source path of said second field effect transistor commonly connected said bipolar transistor, a second end of the drain-source path of said first field effect transistor connected to said first external circuit and a second end of said drain-source path of said second field effect transistor connected to said second external circuit, and a gate of said first field effect transistor being responsive to a first logic input signal and a gate of said second field effect transistor being responsive to a second logic input signal which is antiphasic to said first logic input signal;
wherein said resistor in the switching means of said first current supply means and said resistor in the switching means of said second current supply means have a resistive value ratio which is related to $2^n$, n being an integer greater than zero.

7. A current switching circuit according to claim 6, further comprising a plurality of said switching means and a plurality of said constant current supply means, said first external circuit being commonly connected to said plurality of said switching means at said second end of said drain-source path of said first field effect transistor in each of said plurality of said switching means and a plurality of resistors each being connected between the emitters of said bipolar transistors included in said plurality of said constant current supply means.

8. A current switching circuit according to claim 6, further comprising a plurality of said switching means and a plurality of said constant current supply means, wherein said second end of said drain-source path of said first field effect transistor in each of said plurality of said switching means is connected to said first external circuit via a resistor.

9. A current switching circuit according to claim 6, further comprising a second bipolar transistor for forming a current mirror circuit, wherein said constant current supply means is connected to the base of said second bipolar transistor 10. A current switching circuit according to claim 6, further comprising a plurality of inverters for supplying a plurality of said first and second logic input signals.

* * * * *

UNITED STATES PATENT AND TRADEMARK OFFICE
CERTIFICATE OF CORRECTION

PATENT NO. : 5,144,164
DATED : September 01, 1992
INVENTOR(S) : Yasuhiro Sugimoto et al.

It is certified that error appears in the above-identified patent and that said Letters Patent is hereby corrected as shown below:

Claim 1, column 4, line 37, change "present" to --preset--.

Claim 1, column 4, line 39, change "present" to --preset--.

Claim 1, column 4, line 44, change "present" to --preset--.

Claim 6, column 5, line 32, change "includes;" to --includes:--.

Claim 6, column 5, line 34, change "present" to --preset--.

Claim 6, column 5, line 36, change "present" to --preset--.

Claim 6, column 5, line 41, change "present" to --preset--.

Claim 6, column 6, line 4, after "connected" insert --to--.

UNITED STATES PATENT AND TRADEMARK OFFICE
CERTIFICATE OF CORRECTION

PATENT NO. : 5,144,164
DATED : September 1, 1992
INVENTOR(S) : Yasuhiro Sugimoto, et al.

It is certified that error appears in the above-indentified patent and that said Letters Patent is hereby corrected as shown below:

Claim 9, column 6, line 41, after "transistor" insert --.--.

Signed and Sealed this

Twenty-first Day of December, 1993

Attest:

BRUCE LEHMAN

Attesting Officer            Commissioner of Patents and Trademarks